United States Patent
Lu (12)

(10) Patent No.: US 11,201,422 B2
(45) Date of Patent: Dec. 14, 2021

(54) ACTIVE CABLE WITH EXTERNAL POWER

(71) Applicant: Xiaozheng Lu, Dallas, TX (US)

(72) Inventor: Xiaozheng Lu, Dallas, TX (US)

(73) Assignee: Xiaozheng Lu, Dallas, TX (US)

( * ) Notice: Subject to any disclaimer, the term of this patent is extended or adjusted under 35 U.S.C. 154(b) by 0 days.

(21) Appl. No.: 16/414,038

(22) Filed: May 16, 2019

(65) Prior Publication Data

US 2019/0356070 A1 Nov. 21, 2019

Related U.S. Application Data

(60) Provisional application No. 62/673,970, filed on May 20, 2018.

(51) Int. Cl.
| | |
|---|---|
| *H01R 12/70* | (2011.01) |
| *H01R 13/66* | (2006.01) |
| *H03K 19/20* | (2006.01) |
| *H01R 27/02* | (2006.01) |
| *H01R 13/58* | (2006.01) |
| *H01R 13/717* | (2006.01) |
| *H01R 13/648* | (2006.01) |
| *H01R 13/627* | (2006.01) |

(52) U.S. Cl.
CPC ......... *H01R 12/7088* (2013.01); *H01R 13/58* (2013.01); *H01R 13/665* (2013.01); *H01R 27/02* (2013.01); *H01R 13/6273* (2013.01); *H01R 13/6485* (2013.01); *H01R 13/7175* (2013.01); *H03K 19/20* (2013.01)

(58) Field of Classification Search
CPC .. H01R 13/58; H01R 13/665; H01R 13/6485; H01R 13/7175; H01R 13/6273; H01R 12/7088; H01R 27/02; H03K 19/20
See application file for complete search history.

(56) References Cited

U.S. PATENT DOCUMENTS

| | | | | |
|---|---|---|---|---|
| 9,250,405 B2* | 2/2016 | Tong | .................... | G02B 6/4284 |
| 2011/0256756 A1* | 10/2011 | Lu | ........................ | H01B 7/0892 |
| | | | | 439/449 |

* cited by examiner

*Primary Examiner* — Edwin A. Leon
*Assistant Examiner* — Milagros Jeancharles
(74) *Attorney, Agent, or Firm* — Jonathan A Claypool

(57) ABSTRACT

This invention is an active cable or cables with a female micro USB or other connector recessed at the rear end of the HDMI plug for connecting external power when needed. The recessed connector is connected to an internal circuitry that combines this external power with the power from the source or sink device via a straight or "OR" circuits. This design is clean when no external power is needed because there're no dangling pigtails with USB plugs. When external power is needed because the source or sink devices can't provide enough current, the user can use for example widely available male micro USB to male USB cable (the standard charging cable for most Android phones and many other computer or phone accessories) or other cable to get external power, and the cable length can be selected to fit the application.

5 Claims, 5 Drawing Sheets

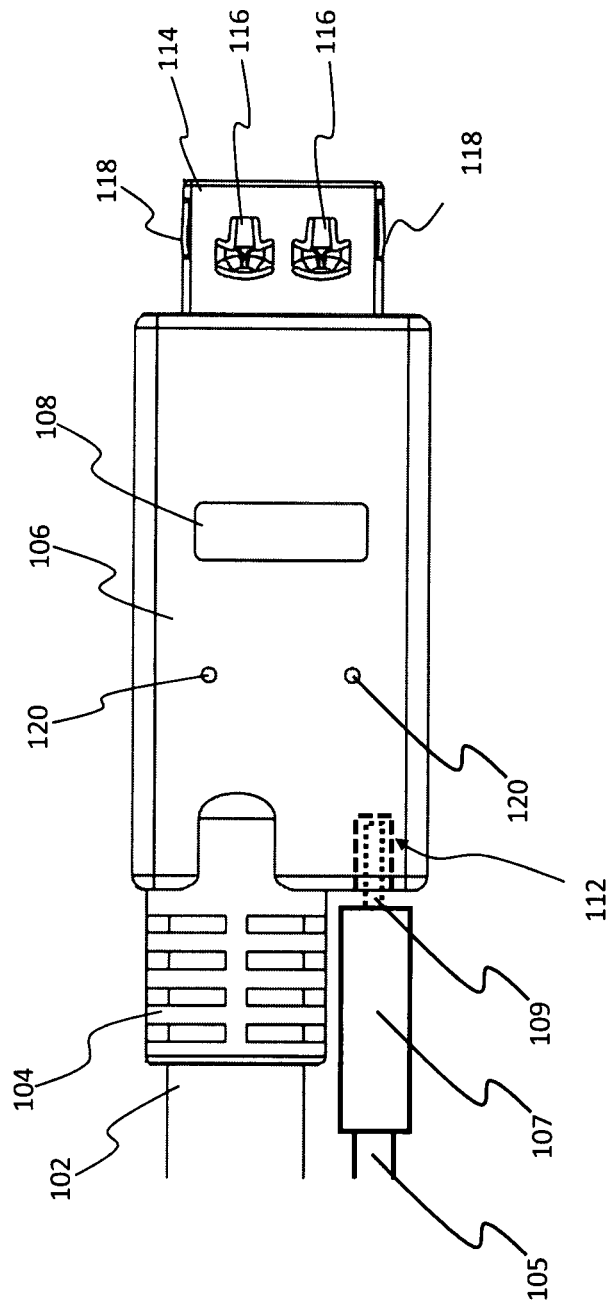

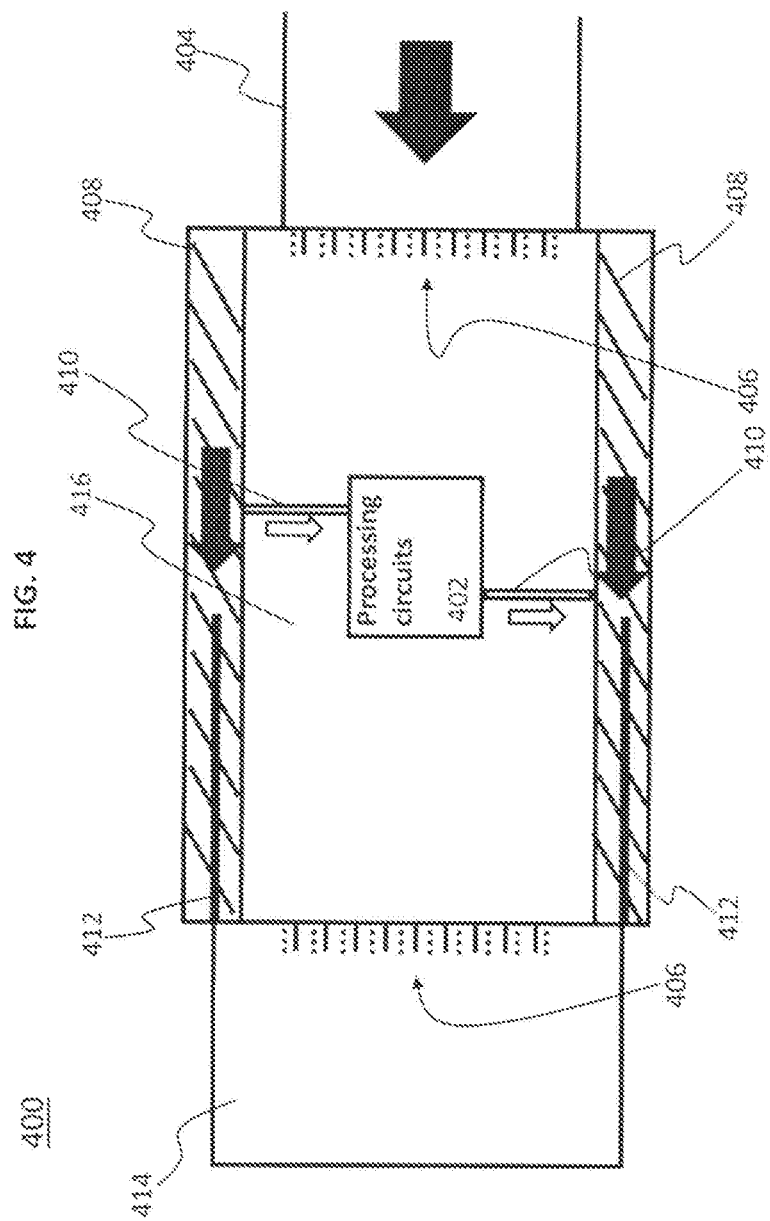

ACTIVE CABLE WITH EXTERNAL POWER

This application incorporates by this reference U.S. Pat. No. 8,500,489 B2, entitled HDMI Locking Connectors and issued Aug. 6, 2013, in its entirety.

CLAIM OF PRIORITY

This application claims priority to U.S. Provisional Application No. 62/673,970, filed May 20, 2018.

FIELD OF THE INVENTION

The invention relates to new technologies and designs in active copper and fiber cables solving the compatibility and drivability issues with clean and flexible solutions.

BRIEF DESCRIPTION OF THE DRAWINGS

FIG. 1B schematically shows an example illustration of an active cable plug from the top or wide side with the backlit window and the optional external micro USB plug shown.

FIG. 4 schematically shows an example illustration of a Printed Circuit Board (PCB) layout with the surge protection and ESD (Electric Static Discharge) protection traces design shown.

BACKGROUND

Figure 1A:
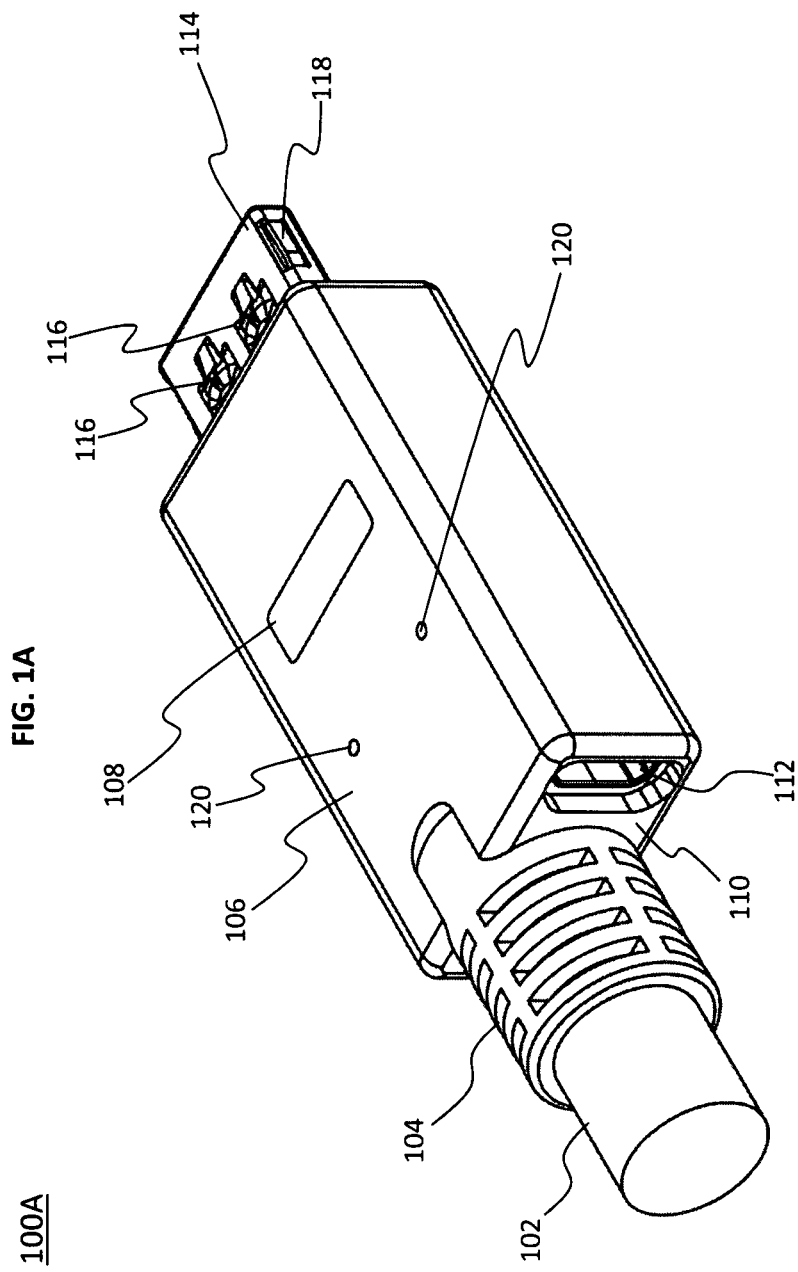
FIG. 1A schematically shows an example illustration of an active cable plug from an angle with the female micro USB connector and backlit window shown.

The current HDMI systems are in transition from 1080p signal resolution to 4 k resolution with the 8 k resolution on the horizon, with very high signal bitrates. The bitrate of a 4 k 60 Hz 4:4:4 signal is about 16 Gbps, while an 8 k 60 Hz 4:4:4 signal is about 64 Gbps! The maximum length of a passive copper cable that can send such 4 k signals is only about 7.5 meter, and only about 1.5 meters for such 8 k signals. Any longer cables must use built in circuits to "Process" the signals. The copper or fiber cables with such circuits are called Active Cables.

The active cable circuits must have power to run. There are two ways to get power: 1) from the source or sink device via the HDMI's 5 V wire; or 2) from an external power source.

The source or sink devices made by different manufacturers can offer different maximum current to the active cable circuits.

Some active cables are designed to use the source device's power via the HDMI's 5 V wire as the sole power source, but this may not work with all source devices. One such example is the new MacBook Pro with the USB-C output to an Apple USB-C to HDMI adaptor which does not provide enough current to power most active cables.

Some other active cables are designed to have permanent short pigtails from the HDMI plugs with male USB plugs at the end. These pigtails are cumbersome and hang awkwardly and often are not used confusing the users in situations when the external power is not needed. Further, the pigtails may not be long enough to reach the USB power port in some cases when the external power is needed. Also there's no indicator to show when the external power is needed in cases where the source device is deficient for power requirements for the active cables.

Active cables are long cables in most cases, and often connect devices in different rooms. The devices in different rooms are often plugged into the power outlets in different AC circuits. This could make the AC ground wires in different rooms have different voltages. When the active cable connect to the devices in different rooms, this difference in voltage will result in AC current flowing through the active cables' components or traces on the PCB. This could burn the components or traces. This is called surge damage. Also the ESD (Electric Static Discharge) from the system operator's human body can be released through the active cable and could also damage the components or traces. This is called ESD damage. The currently available active cables are prone to these two types of damage.

SUMMARY

One aspect of this invention is an active cable with a female micro USB connector recessed at the rear end of the HDMI plug for connecting external power when needed. The micro USB connector is connected to an internal circuit that combines this external power with the power from the source device 301 or sink device 309 via a straight or "OR" circuits. This design is clean when no external power is needed because there're no dangling pigtails with USB plugs. When external power is needed because the source device 301 or sink devices 309 can't provide enough current, the user can use widely available male micro USB to male USB cable (the standard charging cable for most Android phones and many other computer or phone accessories) to get external power, and the cable length can be selected to fit the application.

This invention further has an LED through a backlit window on the active cable plug to show if an external power is needed. The LED is driven by the internal power rail or an output from a voltage comparator. When the cable is plugged into the source device 301 or sink device 309 without external power, if the LED is solidly lit, then no external power is needed. If the LED is blinking or not lit, then the external power is needed. This LED indication feature is crucial to assure installers and end users that cables are working. This backlit window also serves an alternate purpose as decoration; the brand logo can be added to the window to show a glowing brand.

This invention further has surge and ESD protection in the Printed Circuit Board (PCB) layout design. The PCB has wide and straight ground traces connecting the input side and output side of the PCB, so the surge or ESD current will flow thru these thick traces without burning them. In some aspects the IC and other components connect to these wide ground traces by very narrow traces, thus the surge and ESD current will virtually not flow through these smaller and non-straight traces and won't cause component damages either.

In one embodiment an active cable has one, two or more connectors and a cable where at least one connector has a body and internal circuitry on a PCB to Process the signals for long cable runs, and where the internal circuitry can get power from a source device 301 or sink device 309 when the cable is connected to the source or sink device as well as a female connector integrated into the connector for getting power from an external power supply other than the source or sink device 309 when needed. In one embodiment the active cable may be an HDMI, USB, DisplayPort, Lightning, Thunderbolt, or Mobile High-Definition Link (MHL) standard cable. In another embodiment, the active cable can have one or more male connectors, with a probe projecting from the front of the male connector; and have one or more locking springs on the surface or surfaces of the probe. In still another embodiment the active cable female cable connector standard a micro USB, 3.5 mm mini jack, a micro HDMI, Lightning, Thunderbolt, mini DisplayPort, MHL, or a USB Type C connector. In one embodiment the active cable uses bulk wires that can be copper or optical fiber or a mix of copper or optical fiber. In another embodiment the active cable, the circuitry, can have an "OR" circuit on the PCB; wherein the "OR" circuit is configured to join the power from the source device 301 or sink device 309 and the power from the female connector together to feed the internal circuitry of the active cable, and where the "OR" circuit can be configured to only allow current from the power source device 301 with higher voltage to go through while cutting off the power source device 301 with lower voltage. In another embodiment the active cable, can have a power status indicator LED on the internal PCB that indicates if the signal processing circuitry gets enough power to process signals over the active cable. In some embodiments, the internal PCB has one or more wide and straight copper trace configured for bypassing power surge and ESD current, and one or more narrow and angled connected copper trace for connecting the signals to the processing circuitry while isolating the components from power surge and ESD current. In related embodiments, the probe of the connector or connectors of the active cable of has one or more long clamps extended into the connector from the front of the probe, where the clamp is soldered onto the PCB for increased mechanical integrity. In still other related embodiments the active cable has a strain relief, on the cable, such that the female connector is positioned on the same surface of the connector body, and where the active cable and strain relief is positioned off center of the connector body to leave room for the female connector; and where the female connector is also positioned so the body of the external male power cable connector plugged into the female connector will be in parallel to and close in distance to the cable wire and strain relief, providing added protection to the connector.

Although the figures and descriptions are showing the HDMI active cable standard, the inventions also apply to other active cable standards like USB, DisplayPort, Lightning, Thunderbolt, MHL active cables. Although the figures and descriptions are showing the internal power source of 5 V from the connected source device 301 or sink device 309, the inventions also apply to other active cables whose internal power source can be from the sink device 309, and can be voltages other than 5 V (e.g. 3V, 4V, 6V, 7V, 8V, 9V, or 10V or higher, or any voltage increments thereof), and can come from either the connected source device 301 or sink devices 309. Each type of cable names here refers to the whole family of cable variances. For example, "USB" refers to USB 1.x, 2.x, 3.x, 4.x etc., and Type A, B, Mini, Micro, USB-C etc. The bulk wires can be copper or optical fiber or the mix of the two. The female connector for external power can be micro USB, micro HDMI, USB Type C, Lightning, Thunderbolt, mini DisplayPort, MHL or 3.5 mm mini jack.

DETAILED DESCRIPTION

Female Micro USB Connector

Referring to FIG. 1A and FIG. 1B, shown schematically are a relief view and top view of an active HDMI connector 100A. The injection respectively molded body 106 surrounds and insulates inner circuitry and wires for HDMI signal transmission. The bulk wire 102 is shown entering the body 106 and is protected by strain relief 104. The bulk wire 102 is off center from the rear side 110 of the plug body 106, leaving room for a recessed female micro USB connector 112 or other female connector like micro HDMI, USB type C, 3.5 mm mini jack etc. This recessed female connector connects the internal circuit inside this active cable to an external power source when the HDMI source device 301 can't provide enough current. In FIG. 1B, also shows the position of the male micro USB plug body 107, front probe 109 of an optional external micro USB cable 105 positioned as it would be after it's plugged into the female micro USB connector 112. The female micro USB connector 112 is precisely positioned so the mating male micro USB plug body 107 would be neatly in parallel with the HDMI cable 102 and its strain relief 104, thus it will be well protected by them from being bumped or snapped from forces applied to the male micro USB cable and connector, and also would be positioned well within the four plains of the long surface sides of the HDMI plug body 106 and thus not pose any interference with arrays of HDMI connectors plugged into a device panel in parallel next to each other. A LED power indicator 308 (FIG. 3) emits lights through the backlit window 108 to indicate if this active cable gets enough power from the source device 301. This backlit window also serves decoration purpose to light up the logo printed on the window. A HDMI male probe 114 is shown comprising locking spring 116, 118. The injection molding injection holes 120 are also shown.

Figure 2:
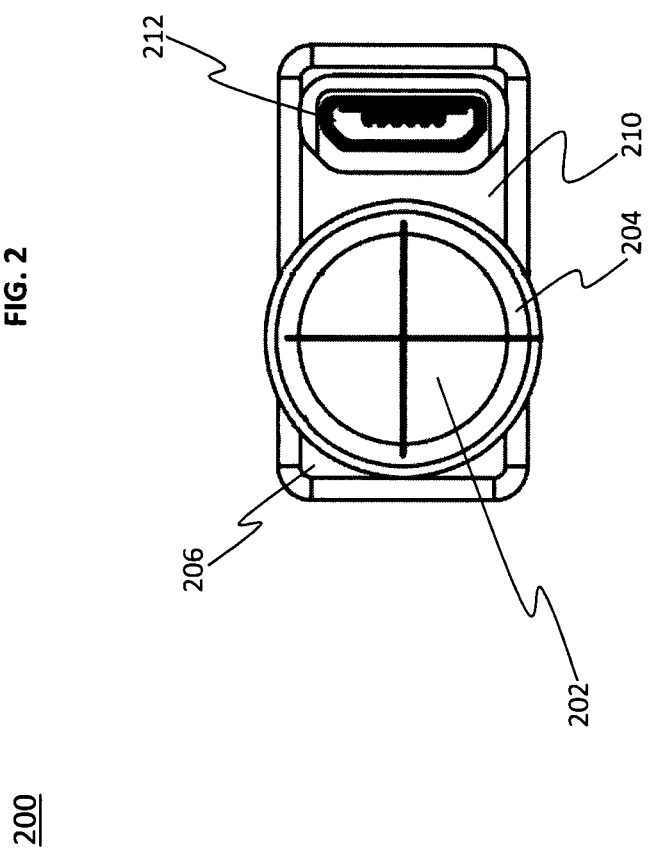
FIG. 2 schematically shows an example illustration of an active cable plug from the rear side with the female micro USB connector shown.

Referring to FIG. 2, shown schematically is an end view of an active HDMI connector 200. The body 206 surrounds and insulates the connector core with the bulk wire 202 entering the connector body 206 and protected by strain relief 204. The bulk wire 202 is off center from the rear side 210 of the plug body 206, leaving room for a recessed female micro USB connector 212 or other female connector like micro HDMI, USB type C, 3.5 mm mini jack etc. This recessed female connector connects the internal circuit inside this active cable to an external power source when the HDMI source device 301 can't provide enough current.

Two Power Source "OR" Circuit; Power Indicator and Signal Processing

Figure 3:
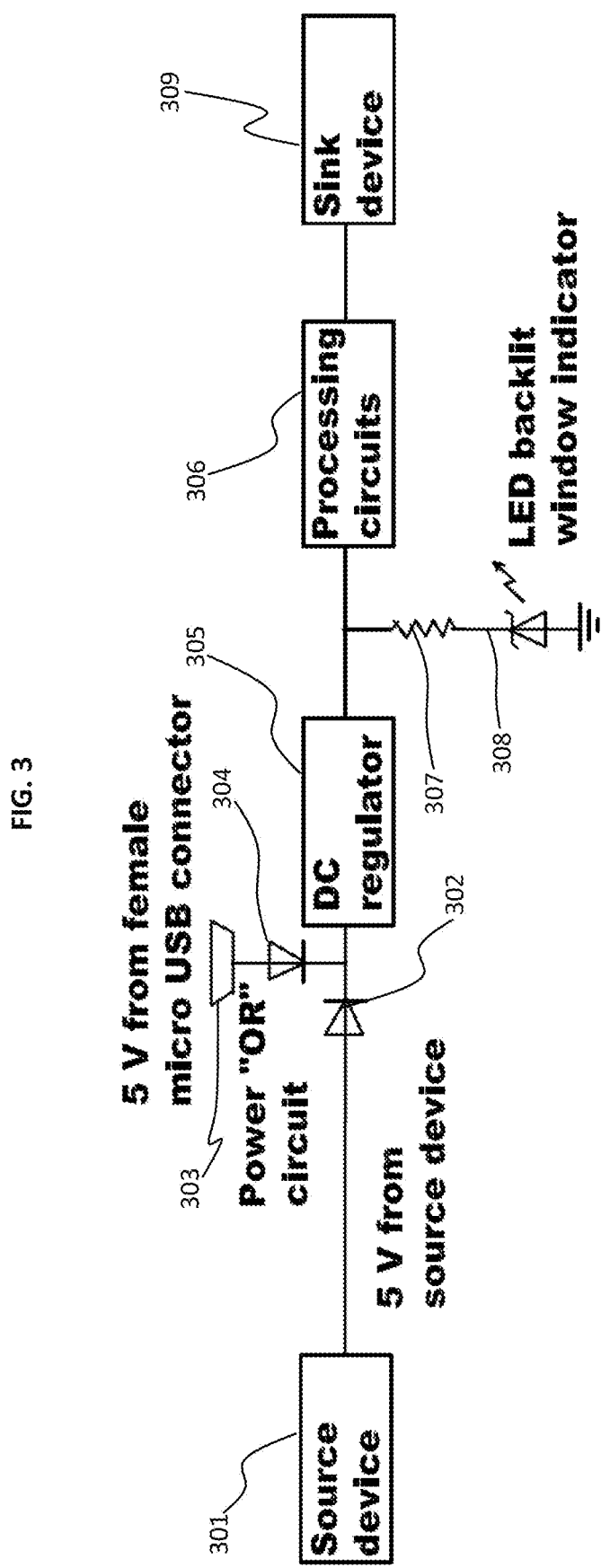
FIG. 3 schematically shows the power portion of the internal circuit with the two power source "OR" circuit, LED (Light Emitting Diode) backlit window indicator and signal processing circuits.

Referring to FIG. 3, shown schematically is the power portion of the active cable internal circuits 300. The 5 V (for example, or any other voltage) from the source device 301 connects to the input of the DC regulator 305 via a first diode 302. The 5 V (for example, or any other voltage) from the external micro USB connector 303 also connects to the input of the DC regulator 305 via a second diode 304. These two diodes 302 and 304 form an "OR" circuit that automatically allows the 5 V (for example, or any other voltage) power source with higher voltage between 301 and 303 to go through while cutting off the power source with lower voltage to prevent reverse powering to that source device 301. The power voltage is regulated by 305 and is then fed to signal Processing Circuits 306, and also to LED power indicator 308 via a resister 307. This design ensures that the power status indicated by LED 308 always correlated with the status of whether the Processing Circuits 306 gets enough power. The Processing Circuits 306 can be either at the far end close to the display to restore the signal by equalizing, reshaping or re-clocking the signals, or at the near end close to the source device 301 by pre-amplifying the signals, or at both ends by encoding the signals to a proprietary format at the near end then decoding back to the original signals at the far end, or other processing methods. Collectively, the actions to "Process" or for "Processing" of the Signals may be performed by various Processing Circuits in different embodiments to improve overall signal quality and audio video functionality. Further, such methods and circuitry to Process signals are known and can be used alone or in any manner of combinations in this Active Cable design representing added embodiments. Further, new methods and circuitry to Process signals are within the scope of this invention and represent prophetic embodiments where specific embodiment Active Cables add circuitry to perform such methods for any such technological development.

Surge and ESD Protection PCB Layout Design

Referring to FIG. 4, shown schematically is the internal components of an active HDMI connector 400 comprising circuitry on a printed circuit board (PCB) for receiving HDMI signals from the source device 301 device via long cable 404, Processing the signal by Processing Circuits 402, then feeding to the display device via HDMI male probe 414 then to the display device. The wide and straight copper traces 408 (the top and bottom areas in FIG. 4 "shaded" by many thin 45 degree angled lines) provide the paths for the large current caused by surges or ESD (Electric Static Discharge) to go through, while the narrow and angled copper traces 410 provides the signal path to the Processing Circuits 402 yet prevent the surge or ESD current (the current always goes through the straight path with the least resistance), thus protecting the sensitive components in the Processing Circuits 402 from being damaged. Pins 406 are also shown on the HDMI probe 414 and PCB 416.

Additionally, the long clamps 412 extended from HDMI front probe 414 are soldered on to the long ground traces 408, making the front probe 414 strongly integrated with the rigid PCB 416, reducing the leverage bending force and also spreading out the force through the long traces by soldering, thus prevent the front probe from snapping off from the connector body when side force is introduced when the cable is accidentally pulled sideways.

What is claimed is:

1. An active cable comprising:
   at least one connector and a cable;
   at least one connector further comprising a body and internal circuitry on a printed circuit board (PCB) to process signals, wherein the internal circuitry can get power from a connected source or sink device; and
   a female connector integrated into the body for getting power from an external power supply other than the source or sink device when needed;
   wherein the internal circuitry, further comprises an "OR" circuit on the PCB;
   wherein the "OR" circuit is configured to join the power from the source or sink device and the power from the female connector together to feed the internal circuitry of the active cable, and wherein the "OR" circuit is configured to only allow current from the power source with higher voltage to go through while cutting off the power source with lower voltage.

2. An active cable comprising:
   at least one connector and a cable;
   at least one connector further comprising a body and internal circuitry on a printed circuit board (PCB) to process signals, wherein the internal circuitry can get power from a connected source or sink device; and
   a female connector integrated into the body for getting power from an external power supply other than the source or sink device when needed;
   the active cable, further comprising a power status indicator Light Emitting Diode (LED) on the PCB that indicates if the internal circuitry get enough power to process signals over the active cable.

3. An active cable comprising:
   at least one connector and a cable;
   at least one connector further comprising a body and internal circuitry on a printed circuit board (PCB) to process signals, wherein the internal circuitry can get power from a connected source or sink device; and
   a female connector integrated into the body for getting power from an external power supply other than the source or sink device when needed;
   the PCB of the active cable, further comprising at least one wide and straight copper trace configured for bypassing power surge and Electrostatic Discharge (ESD) current; and
   at least one narrow and angled connected copper trace for connecting signals to the internal circuitry while isolating the components from power surge and ESD current.

4. The active cable of claim 1, further comprising at least one male connector, the male connector further comprising a probe projecting from the front of the male connector; and
   at least one locking spring on at least one surface on the probe;
   the probe of the at least one connector of the active cable, further comprising at least one long clamp extended into the connector body from the front of the probe;
   at least one solder for each of the long clamps joining the long clamp to the PCB, wherein the solder of the clamp onto the PCB increases mechanical integrity.

5. The active cable of claim 1, further comprising a strain relief, wherein the female connector is positioned on the same surface of the connector body, wherein the active cable strain relief is positioned off center of the connector body to leave room for the female connector; and wherein the female connector is also positioned so the body of an external male power cable connector plugged into the female connector will be in parallel to and close in distance to a cable wire and strain relief, providing added protection to the connector.

* * * * *